US 6,736,710 B2

(12) United States Patent
Osawa et al.

(10) Patent No.: US 6,736,710 B2
(45) Date of Patent: May 18, 2004

(54) POLISHER FOR POLISHING END SURFACE OF SEMICONDUCTOR WAFER

(75) Inventors: Kazunari Osawa, Tokyo (JP); Izuru Morioka, Tokyo (JP); Naotoshi Hosoya, Tokyo (JP)

(73) Assignee: Nihon Microcoating Co., Ltd., Tokyo (JP)

( * ) Notice: Subject to any disclaimer, the term of this patent is extended or adjusted under 35 U.S.C. 154(b) by 4 days.

(21) Appl. No.: 10/402,226

(22) Filed: Mar. 26, 2003

(65) Prior Publication Data
US 2003/0166384 A1 Sep. 4, 2003

Related U.S. Application Data

(63) Continuation of application No. PCT/JP02/05077, filed on May 24, 2002.

(30) Foreign Application Priority Data

Sep. 25, 2001 (JP) ........................................ 2001-290662

(51) Int. Cl.⁷ ................................................. B24B 1/00
(52) U.S. Cl. ........................ 451/311; 451/285; 451/287; 451/288; 451/289; 451/296; 451/307; 451/310
(58) Field of Search ............................... 451/285, 287, 451/288, 289, 296, 307, 310, 311

(56) References Cited

U.S. PATENT DOCUMENTS 2,817,930 A * 12/1957 Dayton, Jr. ................. 451/311
5,361,546 A * 11/1994 Jonsson ..................... 451/310

FOREIGN PATENT DOCUMENTS

| JP | 57-84739 | 5/1982 |
| JP | 59-69260 | 4/1984 |
| JP | 8-71905 | 3/1996 |
| JP | 8-141905 | 6/1996 |
| JP | 8-16947 | 7/1996 |

* cited by examiner

Primary Examiner—Joseph J. Hail, III
Assistant Examiner—Shantese McDonald
(74) Attorney, Agent, or Firm—Beyer Weaver & Thomas LLP

(57) ABSTRACT

A polishing head for polishing the end surface of a semiconductor wafer has a driver roller, a driving motor for rotating it, a pair of upper and lower follower rollers one above the other parallel to and horizontally separated from the driver roller and an endless polishing belt around these rollers. As the driving motor causes the polishing belt to run around the rollers, the semiconductor wafer is pushed against the polishing belt between the upper and lower follower rollers. A pair of upper and lower tension-controlling rollers are provided for controlling the tension in the polishing belt between the two follower rollers. At least one of these tension-controlling rollers is movable vertically. A polisher is formed with such a polishing head, a holder for holding and rotating the wafer and an attaching device for attaching the polishing head to the polisher.

10 Claims, 5 Drawing Sheets

POLISHER FOR POLISHING END SURFACE OF SEMICONDUCTOR WAFER

This application is a continuation of PCT/JP02/05077, filed May 24, 2002.

BACKGROUND OF THE INVENTION

This invention relates to a polisher for polishing the end surface of a semiconductor wafer and a polishing head for such a polisher.

Semiconductor wafers are produced by forming insulating films and metallic films which become the wiring on a semiconductor substrate. During the production of such a wafer, the metallic film may roll over its end surface and if such parts become peeled off and start floating, they may end up by getting attached to the wiring structure on the semiconductor substrate. As a result, semiconductor chips obtained by cutting such a semiconductor wafer may not be able to function as designed. Thus, it is necessary to remove such rolling-over parts produced on the end surface of a semiconductor wafer and the polishing of the end surface of a semiconductor wafer has become an important part of the production process for wafers.

Conventionally, the end surface of a semiconductor wafer is polished by affixing a polishing pad around a columnar polishing drum, placing the semiconductor wafer on a holder table, and rotating the drum while pressing the semiconductor wafer placed on the holder table disposed perpendicularly or obliquely, as disclosed, for example, in Japanese Patent Publications Tokkai 1-71656 and 3-208550. With a conventional device of this type, however, the wafer must be turned over and reset on the table after one side is polished such that the other side can be similarly polished because the wafer is positioned perpendicularly or obliquely to the surface of the polishing pad around the polishing drum. This tends to increase the time required for the polishing work.

When the polishing pad of such a prior art polisher is replaced, the polishing drum is dismantled from the polisher first to remove the pad before a new pad is attached around the polishing drum and the drum is then set on the polisher. Such work is both cumbersome and time-consuming.

SUMMARY OF THE INVENTION

It is therefore an object of this invention to provide a polisher and a polishing head for polishing the end surface of a semiconductor wafer easily and to make it easier to replace its tool for the polishing. A polishing head embodying this invention may be characterized as comprising a driver roller, a driving means for rotating this driver roller, a pair of upper and lower follower rollers one above the other parallel to and horizontally separated from the driver roller, and an endless polishing belt around the driver roller and the follower rollers. The polishing belt is caused to run as the driver roller is rotated, and the end surface of the semiconductor wafer is pushed against the polishing belt between the upper and lower follower rollers.

A pair of upper and lower tension-controlling rollers is further provided for controlling the tension in the polishing belt between the upper and lower follower rollers. The upper tension-controlling roller serves to push the polishing belt downward between the upper follower roller and the driver roller, and the lower tension-controlling roller serves to push the polishing belt upward between the lower follower roller and the driver roller. At least one of this pair of upper and lower tension-controlling rollers is made movable in the vertical direction such that the belt can be easily removed and a new replacing belt can be set.

The polishing head may be further provided with a contact pad having a removably attached pressure sensor, disposed on the back side of the polishing belt between the pair of upper and lower follower rollers.

A polisher embodying this invention may be characterized as comprising a polishing head as characterized above, holding means for holding and rotating the wafer, and attaching means for attaching this polishing head to the polisher. According to a preferred embodiment, the attaching means comprises a torque motor having a drive shaft penetrating a support shaft and a connector for connecting the drive shaft with the polishing head. The polishing head has a bearing serving to attach an end part of the support shaft to the polishing head such that the upper and lower follower rollers are parallel. The polishing head rotates upward and downward around the support shaft as the torque motor is activated.

The attaching means may also be characterized as comprising a torque motor having a drive shaft that penetrates a support shaft, a crankshaft mechanism connected to the support shaft through a link, and a connector that connects the drive shaft of this motor with the polishing head. The polishing head has a bearing that serves to attach an end part of the support shaft to the polishing head such that the upper and lower follower rollers are parallel. The connector may include a rotary arm affixed to the drive shaft of the torque motor, a sliding arm affixed to the polishing head, a slide mechanism for connecting between the rotary arm and the sliding arm such that the sliding arm can move with respect to the rotary arm parallel to the support shaft and that the polishing head moves reciprocatingly in an axial direction of the support shaft if the crankshaft mechanism is activated. The slide mechanism may comprise a rail having an indented portion and another rail having a protruding portion, these two rails being parallel to each other and engaging to each other by their indented and protruding portions.

If the polishing head has a contact pad as described above, this contact pad may be characterized not only as being disposed on the back side of the polishing belt between the pair of upper and lower follower rollers but also wherein the support shaft is adjusted to a point on the surface of the contact pad facing the polishing belt.

With a polishing head thus structured, or a polisher provided with such a polishing head, it is not necessary to polish each end surface of a wafer at a time and the polishing can be carried out easily in a short time. Moreover, the polishing belt as the tool for the polishing can be exchanged easily and quickly.

DETAILED DESCRIPTION OF THE INVENTION

Figure 1A:
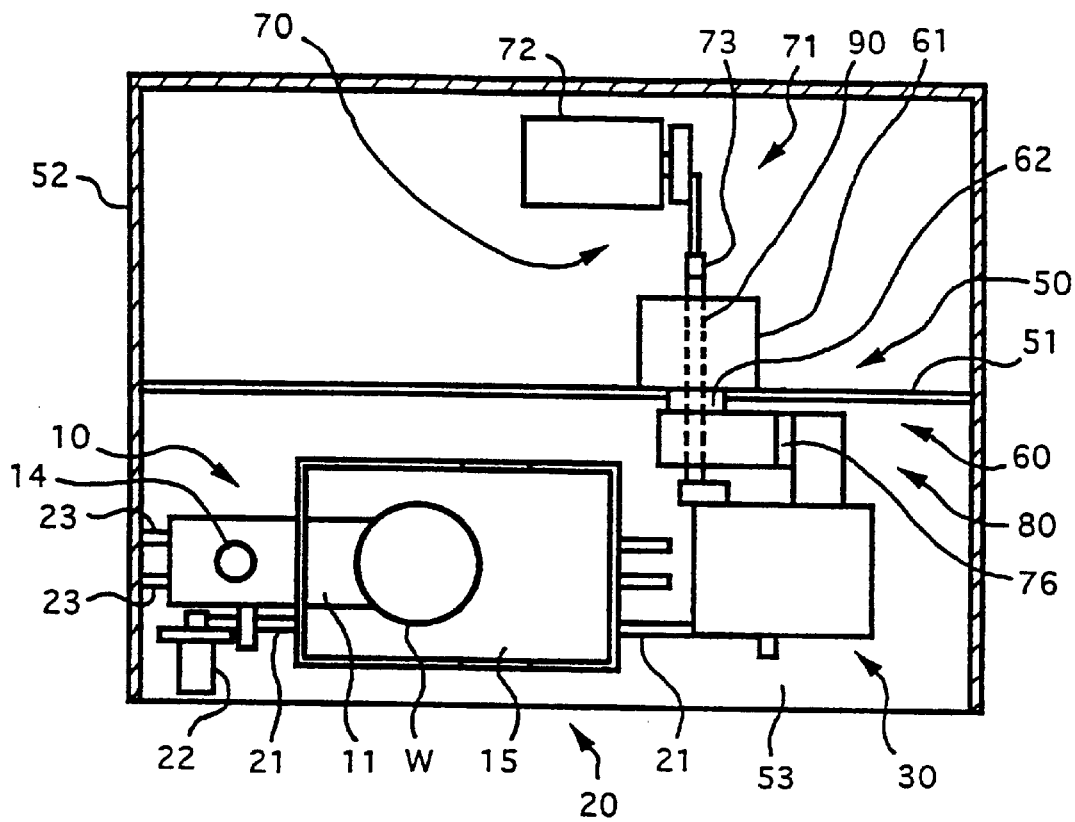
FIG. 1(a) is a plan view of a polisher embodying this invention for polishing the end surface of a semiconductor wafer and FIG. 1(b) is its front view.
Figure 1B:
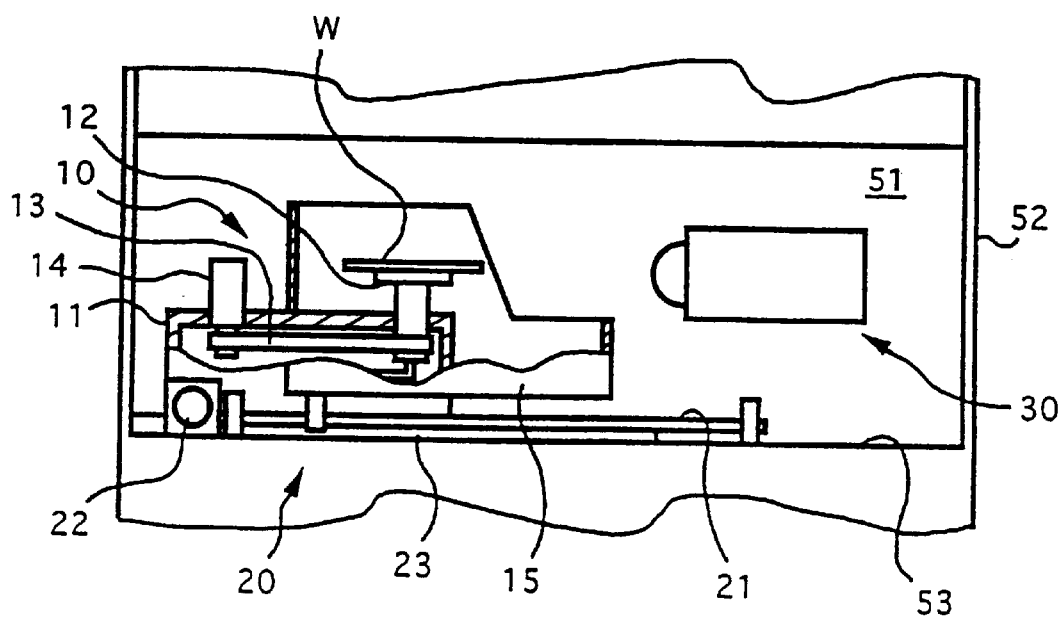

FIGS. 1(a) and 1(b) show a polisher embodying this invention for polishing the end surface of a semiconductor wafer comprising a holding means 10 for holding and rotating a semiconductor wafer W, a polishing head 30 for polishing its end surface and an attaching means 50 for attaching the polishing head 30 to the polisher. According to the illustrated example, the holding means 10 is comprised of a rotary table 12 with suction openings connected to a suction pump (not shown), a motor 14 for rotating the table 12 by way of a belt 13 and a liquid container 15 for collecting liquids which have been supplied to the semiconductor wafer W through nozzles (not shown) during a polishing process such as a polishing liquid, a coolant and a washing liquid and discharging them to the exterior. Each of these constituent parts is attached to a holder table 11 which is set so as to be reciprocatingly movable in a horizontal direction on rails 23 attached on top of a horizontal shelf 53 inside a housing 52. The holder table 11 is adapted to move horizontally on the rails 23 by table-driving means 20 including a ball screw 21 and a motor 22 for driving the ball screw 21.

The semiconductor wafer W carried on the holding means 10 is moved towards the polishing head 30 by means of the table-driving means 20. It is returned to its original position after a polishing process is finished, and the suction pump is stopped and removed from the rotary table 12.

The polisher is further provided with a positioning device (not shown) of a known type having a frame with an opening of the same shape as the semiconductor wafer W for positioning the semiconductor wafer W accurately on the rotary table 12. When the wafer W is to be deposited on the rotary table 12, the frame of the positioning device is moved to the target position where the wafer W is intended to be carried on the rotary table 12 and the wafer W is then fitted therein. After the wafer W is securely positioned at the target position by activating the suction pump, the frame is operated upon and removed from the wafer W.

There are no particular limitations on the attaching means 50 for attaching the polishing head 30 as long as the polishing head 30 can be thereby attached at a specified position while its orientation can be freely varied. The attaching means 50 which is illustrated as an example is comprised of a support shaft 90 rotatably supported by a partition wall 51 and a motor or the like for controlling the rotary motion of this shaft 90. The polishing head 30 is attached to one end of this shaft so as to be able to move upward and downward around this shaft at a specified position. FIG. 1(a) shows the attaching means 50 as comprising a rotating means 60 for causing the polishing head 30 to rotate around the support shaft 90 and a moving means 70 for moving the polishing head 30 reciprocatingly along the shaft 90.

Figure 2:
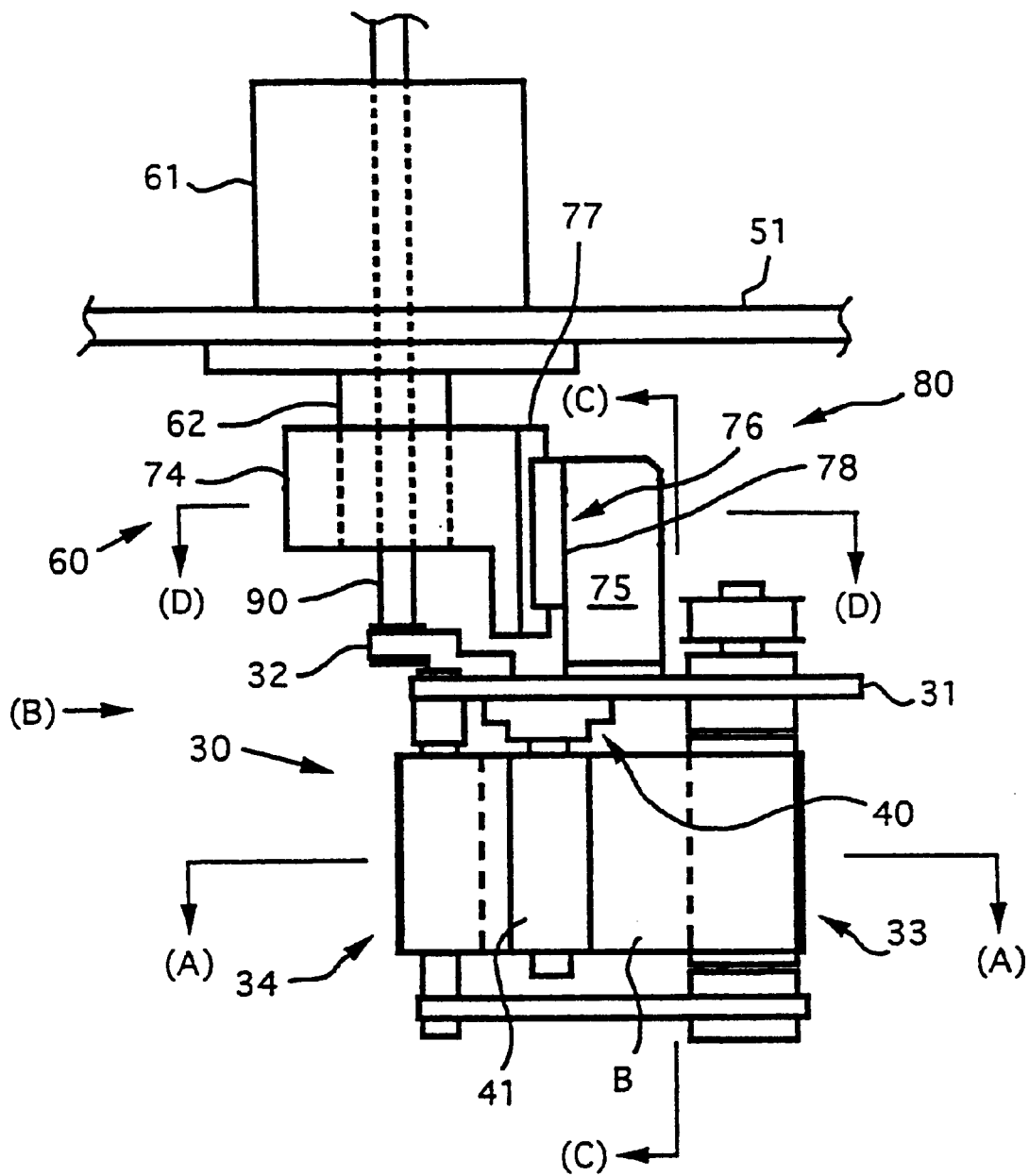
FIG. 2 is a plan view of a polishing head embodying this invention.

As shown in FIGS. 1(a) and 2, the rotating means 60 includes a torque motor 61 with its drive shaft 62 through which the support shaft 90 penetrates and a connector 80 for connecting the drive shaft 62 and the polishing head 30. The polishing head 30 is attached to one end part of the support shaft 90 through a bearing 32 affixed to a plate 31 so as to be rotatable upward and downward around the support shaft 90. As the torque motor 61 is operated, the polishing head 30 can be rotated by a fixed angle around the support shaft 90 or continuously upward or downward within a certain angular range. This angular range may be conveniently set to be between 80° downward and 80° upward, or −80°~+80°.

Figure 6:
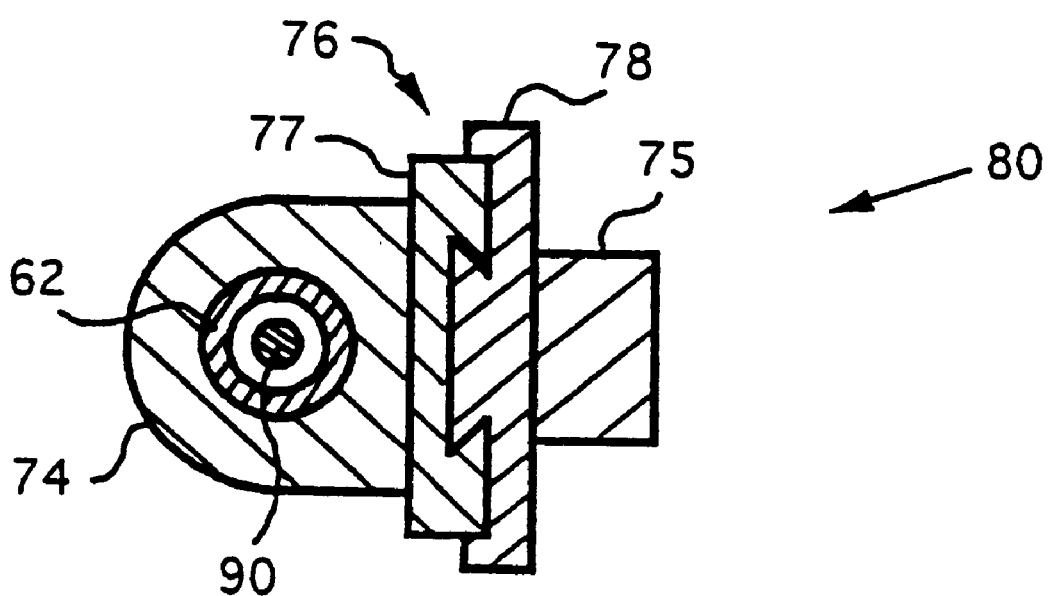
FIG. 6 is a sectional view taken along line (D)—(D) of FIG. 2.

As shown in FIGS. 1(a) and 2, the moving means 70 may comprise a crankshaft mechanism 71 of a known type connecting the back end portion of the support shaft 90 with a head-moving motor 72 through a link 73 and a slide mechanism 76 with a connecting means 80 for connecting the drive shaft 62 of the torque motor 61 with the polishing head 30. As shown in FIG. 6, the slide mechanism 76 serves to connect a rotary arm 74 affixed to the drive shaft 62 of the torque motor 61 and a sliding arm 75 affixed to the polishing head 30 through a rail 77 (the "first rail") having an indented portion and another rail (the "second rail") 78 having a protruding part such that they engage to each other and the sliding arm 75 can slide with respect to the rotary arm 74 in the axial direction of the support shaft 90. As the head-moving motor 72 of the crankshaft mechanism 71 is operated, the polishing head 30 can move reciprocatingly in the axial direction of the support shaft 90. Thus, according to the illustrated example, the polishing head 30 can be moved reciprocatingly in the axial direction of the support shaft 90 while rotating upward or downward with respect to the support shaft 90 by operating both the torque motor 61 and the head-moving motor 72 concurrently.

As shown in FIGS. 2–5, the polishing head 30 is composed of a driver roller 33 attached rotatably to the plate 31, a driver motor 36 for rotating this driver roller 33, a pair of upper and lower follower rollers 34 and 35 attached to the plate 31 next to each other at forward directions from the driver roller 33 so as to be parallel to the driver roller 33 and an endless polishing belt B stretched over these rollers 34 and 35. As the driver motor 36 is operated and the driver roller 33 rotates, the endless polishing belt B over the upper and lower rollers 34 and 35 begins to travel. The polishing of the end surface of the wafer W carried on the holding means 10 is effected by pressing it against this running belt B.

Polishing belts of known types with fixed and free abrading particles may be used for the purpose of this invention. For polishing with fixed abrading particles, use may be made of an endless belt with single or compound particles, having formed thereon a polishing layer with one or more kinds of abrading particles selected from the group of microscopic particles consisting of diamond, aluminum oxide, silica and cerium oxide fixed on the surface of a plastic sheet, a woven cloth sheet, a non-woven cloth sheet, a foamed sheet or a sheet with planted hair. For polishing with free abrading particles, use may be made of a woven cloth sheet, a non-woven cloth sheet, a foamed sheet or a sheet with planted hair.

Although the illustrated example (FIGS. 4 and 5) shows the driver roller 33 connected to the driver motor 36 affixed to the plate 31 through a belt 37, the belt 37 may be replaced by gears for transmitting the rotary motion of the driver motor 36 to the driver roller 33.

Figure 3:
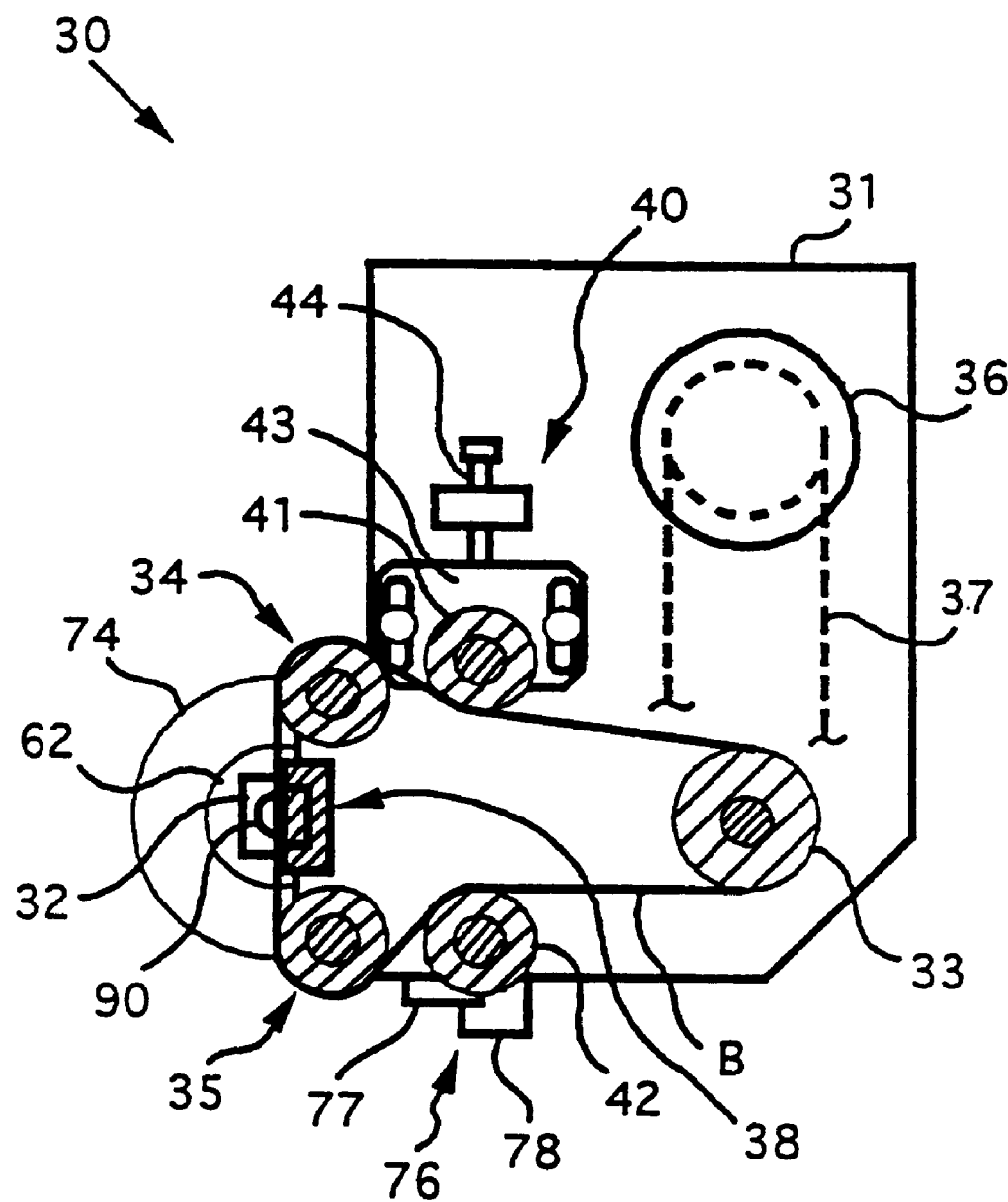
FIG. 3 is a sectional view taken along line (A)—(A) of FIG. 2.
Figure 4:
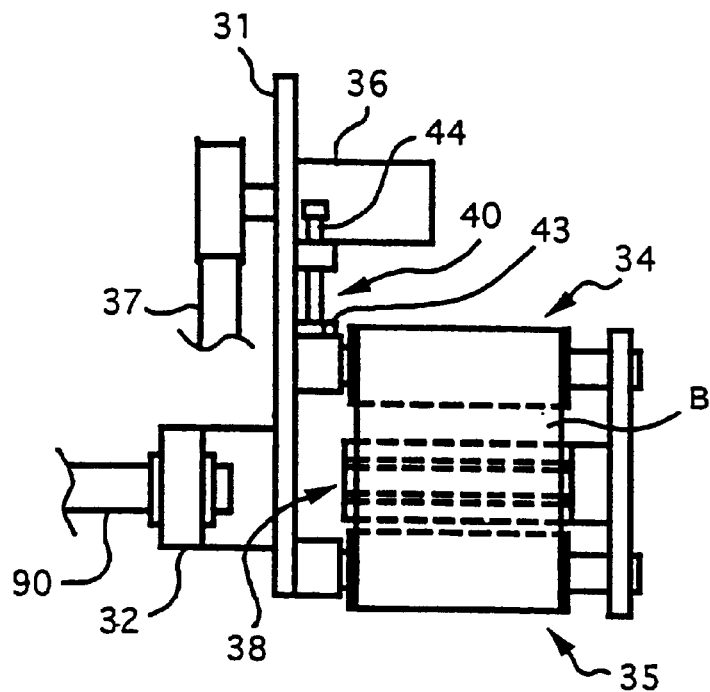
FIG. 4 is a side view of the polishing head of FIG. 2 seen from (B).
Figure 5:
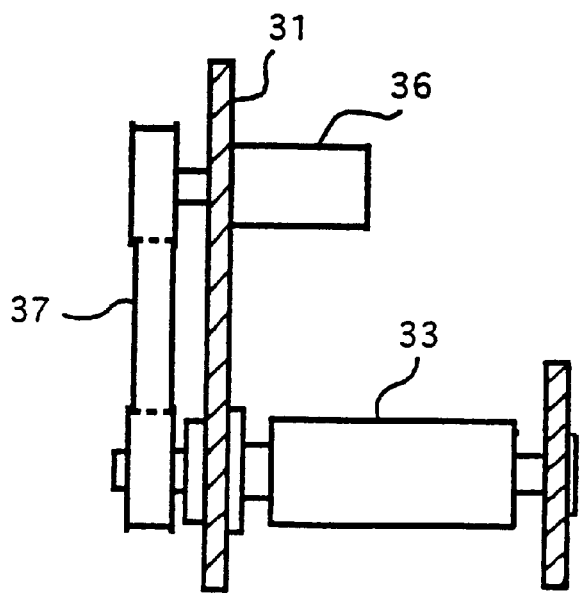
FIG. 5 is a sectional view taken along line (C)—(C) of FIG. 2.

The polishing head 30 according to this invention is further provided with a pair of upper and lower tension-controlling rollers 41 and 42 for controlling the tension in the polishing belt B between the follower rollers 34 and 35. It is preferable to make at least one of these tension-controlling rollers 41 and 42 movable in a vertical direction or removable such that the polishing belt B can be removed easily for replacement. FIG. 3 shows the upper tension-controlling roller 41 made movable upward and downward by means of an adjusting means 40 comprised of an adjuster block 43 to which the upper roller 41 is rotatably attached and a ball screw 44 for causing this adjuster block 43 to undergo a vertical motion. As the handle at the top of the ball screw 44 is turned, the upper roller 41 can be appropriately moved upward or downward together with the adjuster block 43. Thus, the polishing belt B can be removed for replacement by simple operations, that is, by turning the ball screw 44 to move the upper tension-controlling roller 41 upward together with the adjuster block 43 and to thereby loosen the polishing belt B, removing the polishing belt B from the rollers 33, 34 and 35, placing a new polishing belt B around and over the rollers 33, 34 and 35 and turning the ball screw 44 to move the upper tension-controlling roller 41 downward and to thereby adjust the tension of the polishing belt B.

As shown in FIG. 3, the polishing head 30 according to this invention is further provided with a contact pad 38 which is on the back side (away from the wafer) of the polishing belt B between the upper and lower follower rollers 34 and 35 and has a removable pressure sensor. This contact pad 38 is for sensing the pressure with which the polishing belt B is pressed against the end surface of the wafer W during a polishing process. This pressure can be controlled by the aforementioned table-driving means 20.

The bearing 32 for the support shaft 90 is set on the plate 31 such that the support shaft 90 will be adjusted to one point on the surface of this contact pad 38 on the side of (or facing) the polishing belt B. The polishing head 30 rotates upward and downward around the support shaft 90 thus adjusted to this point where the end surface of the wafer W is pressed against the polishing belt B.

The end surface of the wafer W can be polished by a prior art method with fixed or free abrading particles. Polishing by a method with fixed abrading particles may be effected by using a polishing belt having a polishing layer with fixed abrading particles formed on its surface and supplying a cooling liquid onto the wafer W. In the case of a method with free abrading particles, a polishing belt made of a sheet planted with hair, a woven cloth sheet, a non-woven cloth sheet or a foamed sheet is used while a polishing liquid with abrading particle suspended in water or a water-based dispersant liquid is supplied too the wafer W. A polishing liquid of a known type used in chemical mechanical polishing may be used as the polishing liquid.

Polishing of the end surface of the wafer W is effected by running the polishing belt B of the polishing head 30, pressing the end surface of the wafer W against this polishing belt B and rotating the wafer B while causing the polishing head 30 to undergo a reciprocating motion in the axial direction of the support shaft 90 with the polishing head 30 tilted appropriately around the support shaft 90. In the case of a wafer having what is commonly referred to as an "orientation flat", the end surface of the orientation flat can be polished by bringing the wafer W towards the polishing head 30 and pressing the end surface of the orientation flat against the polishing belt B.

What is claimed is:

1. A polishing head for polishing an end surface of a semiconductor wafer, said polishing head comprising:
    a driver roller;
    a driving means for rotating said driver roller;
    a pair of upper and lower follower rollers one above the other parallel to said driver roller;
    an endless polishing belt around said driver roller and said follower rollers; and
    a pair of upper and lower tension-controlling rollers for controlling tension in said polishing belt between said upper and lower follower rollers, said upper tension-controlling roller serving to push down said polishing belt between said upper follower roller and said driver roller, said lower tension-controlling roller serving to push up said polishing belt between said lower follower roller and said driver roller;
    wherein said polishing belt runs as said driver roller is rotated.

2. The polishing head of claim 1 wherein at least one of said pair of upper and lower tension-controlling rollers is vertically movable.

3. The polishing head of claim 1 further comprising a contact pad having a removably attached pressure sensor, said contact pad being disposed on a back side of said polishing belt between said pair of upper and lower follower rollers.

4. A polisher for polishing an end surface of a semiconductor wafer, said polisher comprising:
    a polishing head;
    holding means for holding and rotating said wafer; and
    attaching means for attaching said polishing head to said polisher;
    wherein said polishing head comprises:
        a driver roller;
        a driving means for rotating said driver roller;
        a pair of upper and lower follower rollers one above the other parallel to said driver roller;
        an endless polishing belt around said driver roller and said follower rollers; and
        a pair of upper and lower tension-controlling rollers for controlling tension in said polishing belt between said upper and lower follower rollers, said upper tension-controlling roller serving to push down said polishing belt between said upper follower roller and said driver roller, said lower tension-controlling roller serving to push up said polishing belt between said lower follower roller and said driver roller;
        wherein said polishing belt runs as said driver roller is rotated.

5. The polisher of claim 4 wherein said attaching means comprises a torque motor having a drive shaft that penetrates a support shaft and a connector that connects said drive shaft and said polishing head, said polishing head having a bearing that serves to attach an end part of said support shaft to said polishing head such that said upper and lower follower rollers are parallel, said polishing head rotating upward and downward around said support shaft as said torque motor is activated.

6. The polisher of claim 5 wherein said polishing head further comprises a contact pad having a removably attached pressure sensor, said contact pad being disposed on a back side of said polishing belt between said pair of upper and lower follower rollers, said support shaft being adjusted to a point on a surface of said contact pad facing said polishing belt.

7. The polisher of claim 4 wherein said attaching means comprises a torque motor having a drive shaft that penetrates a support shaft, a crankshaft mechanism connected to said support shaft through a link, and a connector that connects said drive shaft and said polishing head, said polishing head having a bearing that serves to attach an end part of said support shaft to said polishing head such that said upper and lower follower rollers are parallel, said connector including a rotary arm affixed to said drive shaft of said torque motor, a sliding arm affixed to said polishing head, a slide mechanism for connecting between said rotary arm and said sliding arm such that said sliding arm moves with respect to said rotary arm parallel to said support shaft, said polishing head moving reciprocatingly in an axial direction of said support shaft if said crankshaft mechanism is activated.

8. The polisher of claim 7 wherein said slide mechanism comprises a first rail having an indented portion and a second rail having a protruding portion, said first rail and said second rail being parallel to each other and engaging to each other by said indented portion and said protruding portion.

9. The polisher of claim 8 wherein said polishing head further comprises a contact pad having a removably attached pressure sensor, said contact pad being disposed on a back side of said polishing belt between said pair of upper and lower follower rollers, said support shaft being adjusted to a point on a surface of said contact pad facing said polishing belt.

10. The polisher of claim 7 wherein said polishing head further comprises a contact pad having a removably attached pressure sensor, said contact pad being disposed on a back side of said polishing belt between said pair of upper and lower follower rollers, said support shaft being adjusted to a point on a surface of said contact pad facing said polishing belt.

* * * * *